(12) United States Patent
Tsuchiya

(10) Patent No.: US 8,941,063 B2
(45) Date of Patent: *Jan. 27, 2015

(54) THERMAL DETECTOR, THERMAL DETECTION DEVICE, ELECTRONIC INSTRUMENT, AND THERMAL DETECTOR MANUFACTURING METHOD

(75) Inventor: Yasushi Tsuchiya, Fujimi-machi (JP)

(73) Assignee: Seiko Epson Corporation, Tokyo (JP)

( * ) Notice: Subject to any disclaimer, the term of this patent is extended or adjusted under 35 U.S.C. 154(b) by 528 days.

This patent is subject to a terminal disclaimer.

(21) Appl. No.: 13/329,468

(22) Filed: Dec. 19, 2011

(65) Prior Publication Data

US 2012/0161004 A1 Jun. 28, 2012

(30) Foreign Application Priority Data

Dec. 22, 2010 (JP) ................. 2010-286334
Dec. 27, 2010 (JP) ................. 2010-289491
Dec. 27, 2010 (JP) ................. 2010-289492
Jan. 24, 2011 (JP) ................. 2011-012060
Feb. 23, 2011 (JP) ................. 2011-036886

(51) Int. Cl.
*G01J 5/08* (2006.01)
*G01J 5/34* (2006.01)
*G01J 5/02* (2006.01)
(Continued)

(52) U.S. Cl.
CPC ............ *G01J 5/34* (2013.01); *G01J 5/0225* (2013.01); *G01J 5/024* (2013.01); *G01J 5/025* (2013.01); *G01J 5/0853* (2013.01); *G08B 13/19697* (2013.01); *H01L 37/02* (2013.01); *H01L 35/34* (2013.01)

USPC ............... 250/338.3; 250/338.4; 250/338.1; 250/332

(58) Field of Classification Search
CPC ............... G01J 5/34; G01J 5/20; G01J 5/12
USPC ................ 250/338.3, 338.4, 338.1, 332
See application file for complete search history.

(56) References Cited

U.S. PATENT DOCUMENTS 5,283,438 A    2/1994    Dautriche
6,031,231 A *   2/2000    Kimata et al. ............ 250/332
(Continued)

FOREIGN PATENT DOCUMENTS

JP      06-037361 A    2/1994
JP      2000-019010 A    1/2000
(Continued)

*Primary Examiner* — David Porta
*Assistant Examiner* — Djura Malevic
(74) *Attorney, Agent, or Firm* — Global IP Counselors, LLP

(57) ABSTRACT

A thermal detector includes a substrate; a support member supported on the substrate interposed by a cavity; a heat-detecting element formed on the support member; a light-reflecting layer formed at a position spaced apart from the heat-detecting element in at least a portion of a peripheral region of the heat-detecting element on the support member; a light-absorbing layer formed on the heat-detecting element and the light-reflecting layer; and a thermal transfer member that is connected to the heat-detecting element by a connector, the thermal transfer member including a connecting portion connected to the heat-detecting element and a thermal collecting portion disposed inside the light-absorbing layer and having a surface area larger than a surface area of the connecting portion as seen in plan view, the thermal collecting portion being optically transmissive at least with respect to light of a prescribed wavelength.

20 Claims, 8 Drawing Sheets

(51) Int. Cl.
*G08B 13/196* (2006.01)
*H01L 37/02* (2006.01)
*H01L 35/34* (2006.01)

(56) References Cited

U.S. PATENT DOCUMENTS

| | | | |
|---|---|---|---|
| 6,222,111 B1* | 4/2001 | Kern | 136/201 |
| 6,316,770 B1* | 11/2001 | Ouvrier-Buffet et al. | 250/338.1 |
| 6,465,784 B1* | 10/2002 | Kimata | 250/332 |
| 6,489,614 B1 | 12/2002 | Deguchi et al. | |
| 6,690,014 B1* | 2/2004 | Gooch et al. | 250/338.4 |
| 6,781,128 B2* | 8/2004 | Hirota et al. | 250/338.1 |
| 6,949,286 B2* | 9/2005 | Nakajima et al. | 428/331 |
| 2002/0190210 A1 | 12/2002 | Ishikawa et al. | |
| 2004/0256559 A1 | 12/2004 | Ryu et al. | |
| 2009/0072287 A1* | 3/2009 | Noda | 257/295 |
| 2009/0127604 A1* | 5/2009 | Noda | 257/295 |
| 2009/0266987 A1 | 10/2009 | Honda et al. | |
| 2011/0204231 A1* | 8/2011 | Razansky et al. | 250/338.1 |
| 2012/0161005 A1* | 6/2012 | Tsuchiya | 250/338.3 |

FOREIGN PATENT DOCUMENTS

| | | |
|---|---|---|
| JP | 2001-153722 A | 6/2001 |
| JP | 3339276 B2 | 10/2002 |
| JP | 2003-065842 A | 3/2003 |
| JP | 2006-220555 A | 8/2006 |
| JP | 2007-121047 A | 5/2007 |
| JP | 2008-232896 A | 10/2008 |
| WO | WO-99/31471 A1 | 6/1999 |

* cited by examiner

P1: RESONANCE PEAK OF FIRST RESONATOR
P2: RESONANCE PEAK OF SECOND RESONATOR
P3: DETECTION SENSITIVITY OF THERMAL DETECTOR

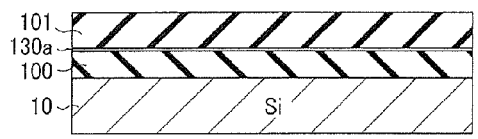
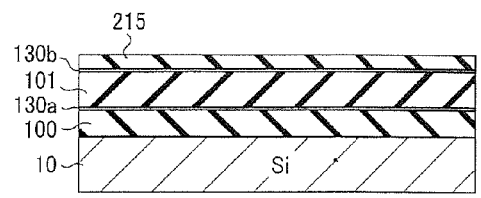
Fig. 3A  Fig. 3B
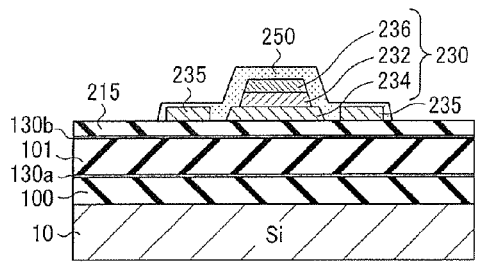
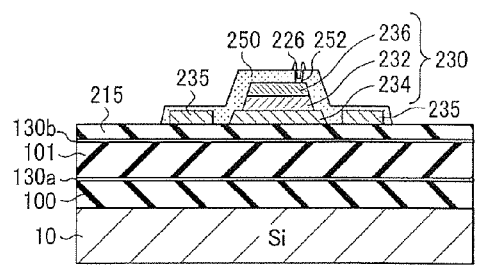
Fig. 3C  Fig. 3D
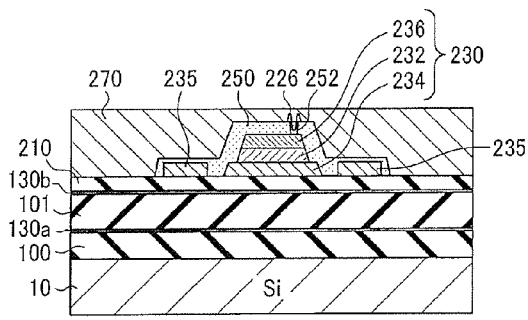
Fig. 3E

US 8,941,063 B2

THERMAL DETECTOR, THERMAL DETECTION DEVICE, ELECTRONIC INSTRUMENT, AND THERMAL DETECTOR MANUFACTURING METHOD

CROSS-REFERENCE TO RELATED APPLICATIONS

This application claims priority to Japanese Patent Application No. 2010-286334 filed on Dec. 22, 2010, Japanese Patent Application No. 2010-289491 filed on Dec. 27, 2010, Japanese Patent Application No. 2010-289492 filed on Dec. 27, 2010, Japanese Patent Application No. 2011-012060 filed on Jan. 24, 2011 and Japanese Patent Application No. 2011-036886 filed on Feb. 23, 2011. The entire disclosures of Japanese Patent Application Nos. 2010-286334, 2010-289491, 2010-289492, 2011-012060 and 2011-036886 are hereby incorporated herein by reference.

BACKGROUND

1. Technical Field

The present invention relates to a thermal detector, a thermal detection device, an electronic instrument, and a thermal detector manufacturing method.

2. Related Art

Thermal detection devices are known as light sensors. Thermal detectors absorb light that has been emitted from an object in a light-absorbing layer, convert the light to heat, and measure the change in temperature with a heat-detecting element. Thermal detectors include thermopiles that directly detect the increase in temperature accompanying light absorption, pyroelectric-type elements that detect a change in electrical polarity, and bolometers that detect the increase in temperature as a change in resistance. Thermal detectors have a characteristically wide wavelength range over which measurements can be made. In recent years, semiconductor fabrication technologies (e.g., MEMS technologies) have been used, and the production of smaller-scale thermal detectors has been attempted.

In order to increase detection sensitivity and improve response in thermal detectors, it is critical to efficiently transfer the heat that is generated in the light-absorbing layer to the heat-detecting element.

The structure of a heat-detecting element for improving thermal transfer efficiency is described, for example, in Japanese Patent No. 3339276. The infrared detecting element described in Japanese Patent No. 3339276 (herein referred to as a thermopile-type infrared detecting element) has a highly thermally conducting layer that is provided between an infrared light sensing part and an infrared light absorbing layer. Specifically, a membrane is formed over a cavity, and the membrane is supported on the surrounding substrate by protruding beams that are provided at the four corners. The center membrane portion has a highly thermally conducting layer and an infrared light absorbing layer, and the edge portions have thermopile elements. In addition, the highly thermally conducting layer is made from a material having excellent infrared light reflectance, such as aluminum or gold.

SUMMARY

In addition, with the infrared light detecting element described in Japanese Patent No. 3339276, a high thermal transfer member is provided under the light-absorbing layer, but the heat-detecting element is not provided below the light-absorbing layer and the high thermal conduction member. The infrared light absorbing layer is at a position that is separated from the infrared sensing part heat-detecting element, and so the heat that is generated in the infrared light absorbing layer cannot be supplied, in some cases, directly to the heat-detecting element infrared light sensing part.

With the infrared light solid-state image capture element described in Japanese Patent Application Republication No. 99/31471, an insulating layer that constitutes an infrared light-absorbing part is in a position that is separated from the temperature detector, and so the heat that is generated in the insulating layer of the infrared light absorbing part, in some cases, cannot be supplied directly to the temperature detector.

In accordance with at least one aspect of the present invention, it is possible to increase the detection sensitivity of a thermal detector.

A thermal detector according to one aspect of the present invention includes a substrate, a support member, a heat-detecting element, a light-reflecting layer, a light-absorbing layer and a thermal transfer member. The support member is supported on the substrate so that a cavity is formed between the substrate and the support member. The heat-detecting element is formed on the support member. The light-reflecting layer is formed on the support member at a position spaced apart from the heat-detecting element in at least a portion of a peripheral region of the heat-detecting element. The light-absorbing layer is formed on the heat-detecting element and the light-reflecting layer. The thermal transfer member includes a connecting portion connected to the heat-detecting element and a thermal collecting portion disposed inside the light-absorbing layer and having a surface area larger than a surface area of the connecting portion as seen in plan view, the thermal collecting portion being optically transmissive at least with respect to light of a prescribed wavelength.

In the thermal detector of this aspect, for example, a portion of the light (e.g., infrared light) that is incident on the thermal detector is first absorbed by the second light-absorbing layer, and the rest of the light reaches the thermal transfer member without being absorbed. The thermal transfer member is optical transmissive with respect to light of at least some wavelengths, and may be semi-transmissive in the infrared region (e.g., the far infrared region), for example. A portion of the light that reaches the thermal transfer member is reflected, and the rest of the light passes through the thermal transfer member, for example. A portion of the light that passes through the thermal transfer member is absorbed by the first light-absorbing layer, and the rest of the light reaches the thermal detection element, the surface of the light-reflecting layer, and the surface of the support member.

The heat-detecting element is formed on the support member. Here, the description "on" may include the meanings of "directly on" and "over the upper part" (in the case that another layer is interposed), and such description may be broadly interpreted in other parts of this description. Since the light-reflecting layer is constituted by a material (e.g., a metal material) having high optical reflectance, most of the light that is incident on the surface of the light-reflecting layer is reflected, and the reflected light is absorbed by the first light-absorbing layer or the second light-absorbing layer. The incident light can thereby be utilized without loss and converted to heat.

Since the light-reflecting layer is formed apart from the heat-detecting element, the heat in the heat-detecting element does not escape via the light-reflecting layer. There is also no increase in parasitic capacitance of the heat-detecting element.

The fact that a portion of the light that reaches the surface of the support member is also reflected and absorbed by the first light-absorbing layer or second light-absorbing layer also contributes to effective utilization of incident light.

The thermal transfer member is constituted by a material which is light-transmissive (e.g., semi-transmissive to light), and has a connecting portion and a thermal collecting portion which has a surface area greater than that of the connecting portion as seen in plan view, and the thermal collecting portion is formed on the heat-detecting element. The thermal collecting portion of the thermal transfer member serves to collect heat generated in a broad region and transfer the heat to the heat-detecting element, for example. A metal compound (e.g., AlN or $AlO_x$) which is semi-transmissive to light and has good thermal conductivity, for example, may be used as the thermal transfer member.

Incident light generates heat in the first light-absorbing layer and second light-absorbing layer, and the generated heat is transferred to the heat-detecting element in the manner described below, for example, in a case in which the incident light behaves as described above. Specifically, a portion of the light (light incident on the region of the support member as seen in plan view) that is incident on the thermal detector is first absorbed by the first light-absorbing layer, and heat is generated in the second light-absorbing layer. The light reflected by the thermal transfer member is absorbed by the second light-absorbing layer, and heat is thereby generated in the second light-absorbing layer.

A portion of the light passed (transmitted) through the thermal transfer member is absorbed by the first light-absorbing layer to generate heat. A large portion (e.g., most) of the light incident on the light-reflecting layer is reflected by the surface thereof and absorbed by at least one of the first light-absorbing layer and the second light-absorbing layer, and heat is thereby generated in the first light-absorbing layer or the second light-absorbing layer. The light reflected by the surface of the support member is also absorbed by at least one of the first light-absorbing layer and the second light-absorbing layer, and heat is thereby generated in the first light-absorbing layer or the second light-absorbing layer.

The heat that has been generated by the second light-absorbing layer is then transferred efficiently through the thermal transfer member to the heat-detecting element, and the heat that has been generated by the first light-absorbing layer is efficiently transferred, either directly or via the thermal transfer member, to the heat-detecting element. Specifically, the thermal collecting portion of the thermal transfer member is formed so that it covers a large region of the heat-detecting element, and thus most of the heat that has been generated by the first light-absorbing layer and the second light-absorbing layer can be transferred efficiently to the heat-detecting element, regardless of the site at which it was generated. For example, even heat that has been generated at locations that are distant from the heat-detecting element can be efficiently transferred to the heat-detecting element via the thermal transfer member having high thermal conductivity.

Because the thermal collecting portion of the thermal transfer member and the heat-detecting element are connected by the connecting portion of the thermal transfer member, the heat that is transferred via the thermal collecting portion or the thermal transfer member can be directly transferred to the heat-detecting element via the connecting portion. Moreover, because the heat-detecting element is positioned below the thermal transfer member (provided in an overlapping position as seen in plan view), for example, it is possible to connect the middle part of the thermal transfer member and the heat-detecting element by the shortest possible length, as seen in plan view. Thus, the loss occurring with heat transfer can be decreased, and an increase in footprint can be minimized.

In addition, in this aspect, absorption efficiency is increased because heat is generated by a two-layer light-absorbing film. Moreover, the heat can be directly transferred to the heat-detecting element via the first light-absorbing layer. Thus, in comparison to the infrared light solid-state image capture element described in Japanese Patent Application Republication No. 99/31471 and the infrared light detection element described in Japanese Patent No. 3339276, the detection sensitivity of the thermal detector can be increased. Moreover, in this aspect, the heat-detecting element is connected to the thermal transfer member, and the response rate is thus high, as with the infrared light-detecting element described in Japanese Patent No. 3339276. In this aspect, because the thermal transfer member is directly connected to the heat detecting element, a higher response rate can be obtained in comparison to the infrared light solid state image capture element described in Japanese Patent Application Republication No. 99/31471.

In another aspect of the thermal detector of the present invention, the light-absorbing layer is preferably disposed on the support member around the heat-detecting element.

In this aspect, the light-absorbing layer is formed on the periphery of the heat-detecting element as seen in plan view. Heat generated in the wide range of the light-absorbing layer is thereby efficiently transferred to the heat-detecting element directly or indirectly via the thermal transfer member. The light detection sensitivity of the thermal detector can thereby be further increased. The response speed of the thermal detector is also further enhanced.

In another aspect of the thermal detector of the present invention, the light-absorbing layer has a first light-absorbing layer contacting the thermal transfer member and disposed between the thermal transfer member and the light-reflecting layer, and a second light-absorbing layer contacting the thermal transfer member and disposed on the thermal transfer member.

In this aspect, a first light-absorbing layer and a second light-absorbing layer are provided as light-absorbing layers, and a configuration is adopted in which the thermal collecting portion of the thermal transfer member is held between the two light-absorbing layers. Heat generated in the wide range of the first light-absorbing layer and second light-absorbing layer is efficiently transferred to the heat-detecting element directly or indirectly via the thermal transfer member. Among the incident light, the light reflected by the thermal transfer member is absorbed by the second light-absorbing layer as the top layer, and the light that passes through the thermal transfer member can be absorbed by the first light-absorbing layer as the bottom layer.

Through the thermal detector of the present aspect, heat generated in a wide range in the (plurality of) two light-absorbing layers can be efficiently transferred to the heat-detecting element, and the light detection sensitivity of a small-sized thermal detector can thereby be significantly enhanced. Since the time required for transfer of heat is also reduced, the response speed of the thermal detector can be increased.

In another aspect of the thermal detector of the present invention, a first optical resonator for a first wavelength is preferably formed between a surface of the light-reflecting layer and an upper surface of the second light-absorbing layer, and a second optical resonator for a second wavelength that is different from the first wavelength is preferably formed between a lower surface of the second light-absorbing layer and the upper surface of the second light-absorbing layer.

In this aspect, the film thickness of each light-absorbing layer is adjusted to form two optical resonators having different resonance wavelengths. The first optical resonator for a first wavelength is formed between the upper surface of the second light-absorbing layer and the surface of the light-reflecting layer formed on the support member. The light reflected by the surface of the light-reflecting layer is absorbed by at least one of the first light-absorbing layer and the second light-absorbing layer, but at this time, the formation of the first optical resonator enables the effective absorption in each light-absorbing layer to be increased. Since the light-reflecting layer is constituted by a material having high light reflectance, a large portion of the light that is incident on the light-reflecting layer can be reflected upward. Resonance of light thereby readily occurs.

Here, the first optical resonator may be a so-called $\lambda/4$ optical resonator, for example. Specifically, taking the first wavelength as $\lambda 1$, it is preferable to adjust the film thicknesses of the first light-absorbing layer and the second light-absorbing layer so that the distance between the surface of the light-reflecting layer of the support member and the upper surface of the second light-absorbing layer satisfies the relationship: $n \cdot (\lambda 1/4)$ (where n is an integer equal to or greater than 1). When the film thickness of the light-reflecting layer is extremely small, the film thickness thereof can be ignored, in which case the total of the film thicknesses of the first light-absorbing layer and the second light-absorbing layer preferably satisfy the relationship: $n \cdot (\lambda 1/4)$ (where n is an integer equal to or greater than 1). As a result, incident light of wavelength $\lambda 1$ and light of wavelength $\lambda 1$ that is reflected by the surface of the support member interfere and cancel each other out, and the effective absorption of the first light-absorbing layer and the second light-absorbing layer is increased.

Moreover, as described above, the light that has been reflected by the thermal transfer member is absorbed by the second light-absorbing layer, and the effective absorption in the second light-absorbing layer can be increased, in this case, by providing a second optical resonator. For example, a so-called $\lambda/4$ optical resonator may be used as the second optical resonator.

Specifically, taking the second wavelength as $\lambda 2$, the second optical resonator can be configured by setting the distance between the lower surface of the second light-absorbing layer and the upper surface of the second light-absorbing layer (i.e., the film thickness of the second light-absorbing layer) to $n \cdot (\lambda 2/4)$. As a result, incident light of wavelength $\lambda 2$ and light of wavelength $\lambda 2$ that is reflected by the lower surface (interface between the first light-absorbing layer and the second light-absorbing layer) of the second light-absorbing layer interfere and cancel each other out, and the effective absorption of the second light-absorbing layer can be increased. The light-reflecting layer and the thermal collecting portion of the thermal transfer member are disposed parallel to each other. The upper surface of the light-reflecting layer and the upper surface of the second light-absorbing layer are thereby kept parallel to each other.

Through the present aspect, because a resonance peak is produced at the two different wavelengths, the wavelength band (wavelength range) of light that can be detected by the thermal detector can be increased.

In another aspect of the thermal detector of the present invention, the thermal transfer member preferably also serves as wiring that electrically connects the heat-detecting element to another element.

The thermal transfer member, as described above, can be constituted by a metal compound such as AlN or $AlO_x$, but a material having metal as a primary component is preferred, due to its favorable electrical conductivity, and the thermal transfer member may also be used as wiring (or a portion of the wiring) that connects the heat-detecting element with other elements. By using the thermal transfer member as wiring, the production steps can be simplified, because it is not necessary to provide the wiring separately.

A thermal detection device according to another aspect of the present invention includes a plurality of the thermal detectors described in any of the aspects above disposed two-dimensionally.

As a result, a thermal detector (thermal type optical array sensor) is realized in which a plurality of the thermal detectors (thermo-optical detection elements) have been disposed two-dimensionally (e.g., disposed in an array formed along two perpendicular axes).

An electronic instrument according to another aspect of the present invention comprises the thermal detector described in any of the aspects above and a control part configured to process an output of the thermal detector.

All of the thermal detectors described above have high detection sensitivity, and thus the performance of the electronic instruments that contain these thermal detectors is improved. Examples of electronic instruments include infrared sensor devices, thermographic devices, on-board automotive night-vision cameras, and surveillance cameras. The control part may be constituted, for example, by an image processing part or a CPU.

A thermal detector manufacturing method according to another aspect of the present invention includes: forming a structure including an insulating layer on a surface of a substrate; forming a sacrificial layer on the structure including the insulating layer; forming a support member on the sacrificial layer; forming a heat-detecting element on the support member; forming a light-reflecting layer on the support member at a position spaced apart from the heat-detecting element in at least a portion of a peripheral region of the heat-detecting element; forming a first light-absorbing layer so as to cover the heat-detecting element and the light-reflecting layer, and planarizing the first light-absorbing layer; forming a contact hole in a portion of the first light-absorbing layer, subsequently forming a material layer which is thermally conductive and optically transmissive at least with respect to light of a prescribed wavelength, and patterning the material layer to form a thermal transfer member having a connecting portion that connects to the heat-detecting element and a thermal collecting portion having a surface area greater than that of the connecting portion as seen in plan view; forming a second light-absorbing layer on the first light-absorbing layer; patterning the first light-absorbing layer and the second light-absorbing layer; patterning the support member; and removing the sacrificial layer to form a cavity between the support member and the structure including the insulating layer formed on the surface of the substrate.

In this aspect, a sacrificial layer, a support member, and a multilayer structure which includes an interlayer insulating film are layered on the primary surface of the substrate, and a heat-detecting element and light-reflecting layer, a first light-absorbing layer, a thermal transfer member, and a second light-absorbing layer are layered on the support member. The upper surface of the first light-absorbing layer is planarized by a planarization treatment. In addition, a contact hole is provided in the first light-absorbing layer, and a thermal transfer member connecting portion is embedded in the contact hole. The thermal collecting portion for the thermal transfer member that is provided on the first light-absorbing layer is connected to the heat-detecting element (e.g., the upper electrode of the pyroelectric capacitor) via the connecting portion. In this aspect, a semiconductor fabrication technique (e.g., an MEMS technique) is used in order to realize a small-sized thermal detector having high detection sensitivity. The light-reflecting layer and the thermal collecting portion of the thermal transfer member are preferably disposed parallel to each other. The upper surface of the light-reflecting layer and the upper surface of the second light-absorbing layer are thereby kept parallel to each other.

In accordance with at last one of the aspects of the present invention, for example, it is possible to additionally increase the detection sensitivity of the thermal detector.

BRIEF DESCRIPTION OF THE DRAWINGS

Referring now to the attached drawings which form a part of this original disclosure:

FIGS. 3A to 3E are diagrams showing the steps for forming the first light-absorbing layer in the thermal detector manufacturing method.

DETAILED DESCRIPTION OF EXEMPLARY EMBODIMENTS

Preferred embodiments of the present invention are described below. The matter of the present invention described in the claims is not unduly limited by the embodiments described below, and it is not essential for all of the configurations described in the embodiments to be used as means for solving the problems.

Embodiment 1

Figures 1A, 1B:
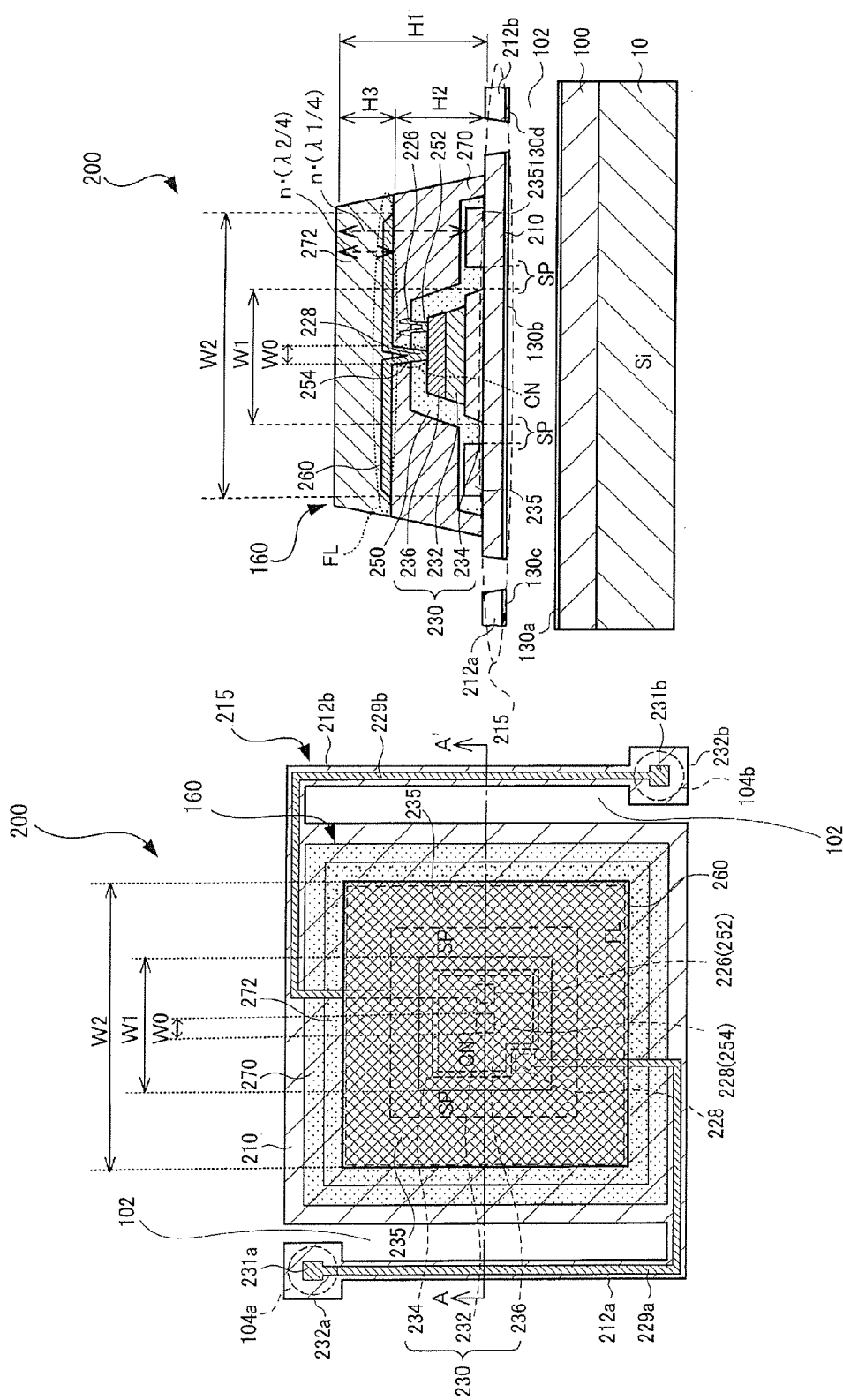
FIG. 1A is a schematic top plan view of an example of a thermal detector according one embodiment.
FIG. 1B is a sectional view of the thermal detector as taken along a section line A-A' in FIG. 1A.

FIGS. 1A and 1B are plan view and a sectional view of an example of the thermal detector. FIG. 1B is a sectional view of the thermal detector, taken along line A-A' in FIG. 1A. In FIGS. 1A and 1B, an individual thermal detector is shown, but a plurality of thermal detectors may be disposed in the form of a matrix in order to produce the configuration of a thermal detector array (e.g., a thermal type detection device).

The thermal detector shown in FIGS. 1A and 1B is a pyroelectric infrared detector (type of optical sensor) 200 (which, however, is merely an example, and does not limit the present invention). The pyroelectric infrared detector 200 is capable of efficiently transferring heat generated by light absorption in two light-absorbing films 270, 272 to a heat-detecting element (here, a pyroelectric capacitor 230) via a thermal transfer member 260 having good thermal conductivity. The pyroelectric capacitor 230 is formed on a support member 215. Here, the description "on" may include the meanings of "directly on" and "on the upper part" (in the case that another layer is interposed), and such description may be broadly interpreted in other parts of this description.

The thermal transfer member 260 may be constituted by a material (e.g., a metal compound such as AlN or $AlO_x$) that has high thermal conductivity and is transmissive (e.g., semi-transmissive) with respect to light of at least some wavelengths of light in the wavelength band (wavelength range) to which the thermal detector has detection sensitivity. The light transmission properties of the thermal transfer member 260 are described below with reference to FIG. 2.

The pyroelectric capacitor 230 that is used as the heat-detecting element converts heat into an electrical signal. As a result, a detection signal (e.g., a current signal) is obtained in accordance with the intensity of the received light, as described in detail below.

Example of Thermal Detector

Pyroelectric Infrared Detector

The sectional structure will first be described with reference to FIG. 1B.

Sectional Structure of Pyroelectric Infrared Detector

The pyroelectric infrared detector 200 that is used as the thermal detector is constituted by a multilayer structure that is formed on a substrate (silicon substrate) 10. Specifically, the pyroelectric infrared detector that is used as the thermal detector 200 comprises a substrate (in this case, a silicon substrate) 10, a structure 100 including an insulating layer that is formed on the primary surface (in this case, the upper surface) of the substrate 10 (e.g., a multilayer structure including an interlayer insulating film; refer to FIG. 6 for a specific example of the multilayer structure), an etching stopper film 130a formed on the surface of the structure 100 including the insulating layer, a cavity for thermal isolation (thermal isolation cavity) 102, a support member (membrane) 215 that is constituted by a mounting part 210 and arm parts 212a and 212b, a pyroelectric capacitor 230 as a heat-detecting element that is formed on the support member (membrane) 215, a light-reflecting layer 235 formed apart from the pyroelectric capacitor 230 as the heat-detecting element in at least a portion of the peripheral region of the heat-detecting element on the support member 215, an insulating layer 250 that covers the surface of the pyroelectric capacitor 230, a first light-absorbing layer (e.g., an $SiO_2$ layer) 270, a thermal transfer member 260 (having a connecting portion CN and a thermal collecting portion FL), and a second light-absorbing layer (e.g., an $SiO_2$ layer) 272. The first light-absorbing layer 270 is formed in contact with the thermal transfer member 260 in between the thermal transfer member 260 and the light-reflecting layer 235. The second light-absorbing layer 272 is formed on the thermal transfer member 260 and in contact with the thermal transfer member 260.

The base part (base) is constituted by the substrate 10 and the multilayer structure 100. This base part (base) supports the element structure 160 that includes the support member 215 and the pyroelectric capacitor 230 in the cavity 102. In addition, a transistor, resistor, or other semiconductor element can be formed, for example, in the region of the silicon (Si) substrate 10 that overlaps with the heat-detecting element (pyroelectric capacitor 230) as seen in plan view (e.g., refer to the example of FIG. 6).

As described above, an etching stopper film (e.g., an $Si_3N_4$ film) 130a is provided on the surface of the multilayer structure 100 that is formed on the substrate 10. In addition, etching stopper films (e.g., $Si_3N_4$ films) 130b to 130d are formed on the back surface of the support member (membrane) 215. The etching stopper films 130a to 130d have the role of preventing removal of layers other than the targets of etching in the step in which the sacrificial layer (not shown in FIG. 1, refer to designation 101 in FIG. 3) is etched in order to form the cavity 102. However, the etching stopper film is not necessary, in some cases, depending on the material that constitutes the support member (membrane) 215.

In addition, the pyroelectric capacitor 230 that is part of the element structure 160 is supported above the cavity 102 by the support member (membrane) 215 which is also part of the element structure 160.

The support member (membrane) 215 can be formed by patterning a three-layer laminate of a silicon oxide film (SiO)/silicon nitride film (SiN)/silicon oxide film (SiO) (this is only an example and does not limit the invention). The support member (membrane) 215 is configured and arranged to stably support the pyroelectric capacitor 230, and thus the total thickness of the support member (membrane) 215 is set to be sufficient to provide the necessary mechanical strength.

An oriented film (not shown in the drawings) is formed on the surface of the support member (membrane) 215, and the pyroelectric capacitor 230 is formed on this oriented film. The pyroelectric capacitor 230 comprises a lower electrode (first electrode) 234, a pyroelectric material layer (e.g., a pyroelectric body PZT layer; lead zirconate titanate layer) 232 that is formed on the lower electrode, and an upper electrode (second electrode) 236 that is formed on the pyroelectric material layer 232.

Each of the lower electrode (first electrode) 234 and the upper electrode (second electrode) 236 can be formed, for example, by laminating three layers of metal film. For example, a three-layer structure may be used in which iridium (Ir), iridium oxide (IrOx) and platinum (Pt) are formed by patterning, for example, in sequence from a location farthest from the pyroelectric material layer (PZT layer) 232. As described above, PZT ($Pb(Zi, Ti)O_3$; lead zirconate titanate) may be used as the pyroelectric material layer 232.

When heat is transferred to the pyroelectric material layer (pyroelectric body), a change in electrical polarity arises in the pyroelectric material layer 232 as a result of the ensuing pyroelectric effect (pyroelectric effect). By detecting the current that accompanies this change in the degree of electrical polarity, it is possible to detect the intensity of the incident light.

This pyroelectric material layer 232 can be formed into a film, for example, by sputtering or MOCVD. The film thickness of the lower electrode (first electrode) 234 and the upper electrode (second electrode) 236 is, for example, about 0.4 μm, and the film thickness of the pyroelectric material layer 232 is, for example, about 0.1 μm.

The pyroelectric capacitor 230 is covered by the insulating layer 250 and the first light-absorbing layer 270. A first contact hole 252 is provided on the insulating layer 250. The first contact hole 252 is used for connecting the electrode 226 of the upper electrode (second electrode) 236 to the upper electrode (second electrode) 236.

The light-reflecting layer 235 is formed apart from the pyroelectric capacitor 230 as the heat-detecting element in at least a portion of the peripheral region of the heat-detecting element on the support member 215. For the sake of effectively utilizing the incident light, the light-reflecting layer 235 is preferably provided on the periphery of the pyroelectric capacitor 230 as seen in plan view. The light-reflecting layer 235 is more preferably provided on the entire periphery of the pyroelectric capacitor 230.

The light-reflecting layer 235 may be constituted by a material (e.g., a metal material) having high optical reflectance. For example, the light-reflecting layer 235 may be constituted by the same material (e.g., a three-layer structure of iridium (Ir), iridium oxide (IrOx), and platinum (Pt)) as the lower electrode (first electrode) 234, which is a constituent element of the pyroelectric capacitor 230. In this case, the lower electrode (first electrode) 234 and the light-reflecting layer 235 can be formed simultaneously by forming the same material primarily composed of a metal on the mounting part 210 of the support member 215 and removing the material of the region SP in FIG. 1B by patterning. The production burden can thereby be reduced.

Since the light-reflecting layer 235 is constituted by a material (e.g., a metal material) having high optical reflectance, a large portion of the light that is incident on the surface of the light-reflecting layer 235 is reflected, and the reflected light is absorbed by the first light-absorbing layer 270 or the second light-absorbing layer 272. The incident light can thereby be utilized without loss and converted to heat.

Since the light-reflecting layer 235 is formed apart from the heat-detecting element, the heat in the heat-detecting element does not escape via the light-reflecting layer. There is also no increase in parasitic capacitance of the heat-detecting element.

Also, the second contact hole 254 is provided in the first light-absorbing layer 270 (and the insulating layer 250). The second contact hole 254 is provided through the first light-absorbing layer 270 and the insulating layer 250. This second contact hole 254 is used in order to connect the thermal transfer member 260 to the upper electrode 236 of the pyroelectric capacitor 230. Specifically, the second contact hole 254 (where the filled portion is indicated by the reference designation 228 in the drawing) can be filled with the same material that constitutes the thermal transfer member 260 (e.g., aluminum nitride (AlN) or aluminum oxide ($AlO_x$)), and, as a result, a connecting portion CN is configured in the thermal transfer member 260.

The thermal transfer member 260 has the thermal collecting portion FL, which is a portion extending over the first light-absorbing layer 270 whose surface is planarized, and the connecting portion CN, which is a portion for connecting the thermal collecting portion FL to the upper electrode (second electrode) 236 in the pyroelectric capacitor 230. The thermal collecting portion FL is optically transmissive with respect to light of at least some wavelengths in the wavelength band (wavelength range) to which the thermal detector 200 has detection sensitivity, and is formed inside the light-absorbing layer (broadly speaking, the light-absorbing layer that includes the first light-absorbing layer 270 and the second light-absorbing layer 272). The thermal collecting portion FL is connected to the heat-detecting element by the connecting portion CN, and has a surface area larger than that of the connecting portion CN as seen in plan view.

The thermal collecting portion FL of the thermal transfer member 260 serves to collect heat generated in a broad region and transfer the heat to the pyroelectric capacitor 230, which is the heat-detecting element, for example. The thermal collecting portion FL is sometimes formed so as to have a flat surface on the planarized first light-absorbing layer 270, for example, in which case the "thermal collecting portion" can also be referred to as a "flat part" or "planar part."

As described above, the thermal transfer member 260 can be constituted by a material that has high thermal conductivity and is transmissive (for example, semi-transmissive) with respect to light of a desired wavelength range, and the thermal transfer member 260 can be constituted by aluminum nitride (AlN) or aluminum oxide ($AlO_x$), for example, or the like. The material of the thermal collecting portion FL may also be different from the material 228 (e.g., the material of the connecting portion plug embedded in the contact hole 254) of the connecting portion CN.

As shown in FIG. 1B, taking the lateral width of the connecting portion CN as W0, taking the lateral width of the pyroelectric capacitor 230 (in this case, the lateral width of the lower electrode (first electrode) 234 having the greatest lateral width) as W1, and taking the lateral width of the thermal collecting portion FL of the thermal transfer member 260 as W2, the relationship W0<W1<W2 is obtained.

In addition, as shown in FIG. 1B, when the first wavelength is taken as $\lambda 1$, and the second wavelength is taken as $\lambda 2$, the distance H1 between the surface of the light-reflecting layer 235 formed on the support member 215 and the upper surface of the second light-absorbing layer 272 is set to $n \cdot (\lambda 1/4)$ (where n is an integer equal to or greater than 1). As a result, a first optical resonator ($\lambda 1/4$ optical resonator) is formed between the surface of the light-reflecting layer 235 and the upper surface of the second light-absorbing layer 272.

Since the film thickness of the light-reflecting layer 235 is adequately small, no particular problems arise from ignoring this film thickness, and the total of the film thickness H2 of the first light-absorbing layer 270 and the film thickness H3 of the second light-absorbing layer 272 can be considered to be the distance H1 described above.

In addition, the distance H3 between the lower surface of the second light-absorbing layer 272 and the upper surface of the second light-absorbing layer 272 (specifically, the film thickness H3 of the second light-absorbing layer 272) is set to $n \cdot (\lambda 2/4)$. As a result, a second optical resonator ($\lambda 2/4$ optical resonator) is constituted between the lower surface of the second light-absorbing layer 272 and the upper surface of the second light-absorbing layer 272. Since the film thickness of the thermal collecting portion FL in the thermal transfer member 260 is adequately small, no particular problems arise from ignoring this film thickness, and the film thickness H3 of the second light-absorbing layer 272 can thus be considered to be the resonator length of the second optical resonator. The effects of configuring the first optical resonator and second optical resonator are described below. The light-reflecting layer 235 and the thermal collecting portion FL of the thermal transfer member 260 are disposed parallel to each other. The top surface of the light-reflecting layer 235 and the top surface of the second light-absorbing layer 272 are thereby kept parallel to each other.

Layout Configuration of Pyroelectric Infrared Detector

Next, the layout configuration will be described with reference to FIG. 1A. As shown in FIG. 1A, the support member (membrane) 215 has a mounting part 210 that carries the pyroelectric capacitor 230 and two arms that hold the mounting part 210 over the cavity (thermal isolation cavity) 102, specifically, a first arm 212a and a second arm 212b. The pyroelectric capacitor 230 is formed on the mounting part 210 in the support member (membrane) 215. In addition, as described above, the configuration of the element structure 160 includes the support member (membrane) 215, the pyroelectric capacitor 230, the first light-absorbing layer 270, the thermal transfer member 260, and the second light-absorbing layer 272.

The first arm 212a and the second arm 212b, as described above, can be formed in long thin shapes by processing involving patterning a three-layer laminated film consisting of a silicon oxide film (SiO), a silicon nitride film (SiN), and a silicon oxide film (SiO). The reason that long thin shapes are produced is to increase thermal resistance and to control heat dissipation (heat release) from the pyroelectric capacitor 230.

The wide distal end part 232a of the first arm 212a is supported above the cavity 102 by a first post 104a (circular member as seen in plan view, represented by a broken line in FIG. 1A). In addition, wiring 229a is formed on the first arm part 212a that connects one end (reference symbol 228) to the lower electrode (first electrode) 234 of the pyroelectric capacitor 230 and the other end 231a to the first post 104a.

The first post 104a, for example, is provided between the structure 100 that includes the insulating layer shown in FIG. 1B and the distal end part 232a of the first arm part 212a. This first post 104a is constituted by a multilayer wiring structure that has been processed into a pillar shape that is selectively formed in the cavity 102 (composed of an interlayer insulating layer and a conductive layer that constitutes wiring for connecting the elements such as transistors provided on the underlying silicon substrate 10 with the pyroelectric capacitor 230).

Similarly the second arm part 212b is supported above the cavity 102 by a second post 104b (in FIG. 1A, a circular member as seen in plan view, represented by a broken line). The broad distal end part 232b in the second arm part 212b is supported over the cavity 102 by a second post 104b (in FIG. 1A, a circular member as seen in a plan view, represented by a broken line). In addition, wiring 229b is formed on the second arm part 212b that connects one end (reference symbol 226) to the upper electrode (second electrode) 236 of the pyroelectric capacitor 230 and the other end 231b to the second post 104b.

The second post 104b, for example, is provided between the structure 100 that includes the insulating layer shown in FIG. 1B and the distal end part 232b of the second arm part 212b. This second post 104b is constituted by a multilayer wiring structure that has been processed into a pillar shape selectively in the cavity 102 (composed of an interlayer insulating layer and a conductive layer that constitutes wiring for connecting the elements such as transistors provided on the underlying silicon substrate 10 with the pyroelectric capacitor 230).

In the example shown in FIG. 1A, the first post 104a and the second post 104b are used in order to hold the element structure 160 including the support member 215 and the pyroelectric capacitor 230 above the cavity 102. With this configuration, it is useful if a plural number of pyroelectric capacitors 230 used as heat-detecting elements are disposed at high density in a shared cavity 102 (in other words, when forming a heat-detecting element array). However, this configuration is only an example and does not limit the present invention. For example, in the example shown in FIG. 6, a single space 102 is formed for each of the individual heat-detecting elements (pyroelectric capacitors) 230, and the support member (membrane) 215 may be supported by the structure 100 including the insulating layer surrounding the cavity 102.

In addition, in FIG. 1A, the pyroelectric capacitor 230 is disposed in the middle region of the mounting part 210 in the support member (membrane) 215, and the pyroelectric capacitor 230 has a roughly square shape, as seen in plan view. Moreover, as shown in FIG. 1A, taking the lateral width of the thermal transfer member 260 in the connecting portion CN as W0, taking the lateral width of the pyroelectric capacitor 230 (in this case, the lateral width of the lower electrode (first electrode) 234 having the greatest lateral width) as W1, and taking the lateral width of the thermal collecting portion FL of the thermal transfer member 260 as W2, the relationship W0<W1<W2 is obtained.

Consequently, the surface area of the thermal collecting portion FL of the thermal transfer member 260 as seen in plan view (from a direction perpendicular to the surface of the substrate 10; i.e., as seen perpendicularly from above) is greater than the surface area of the connecting portion CN. In addition, the surface area of the thermal collecting portion FL of the thermal transfer member 260 as seen in plan view is greater than the surface area of the pyroelectric capacitor 230.

In addition, as shown in FIG. 1A, the first light-absorbing layer 270 and the second light-absorbing layer 272 are formed around the pyroelectric capacitor 230 used as the heat-detecting element, which is on the support member (membrane) 215, as seen in plan view. Consequently, the heat that is generated over a large region of the first light-absorbing layer 270 and the second light-absorbing layer 272 is efficiently transmitted directly to the pyroelectric capacitor 230, or indirectly via the thermal transfer member 260. In other words, the heat that is generated over a large region of the first light-absorbing layer 270 and the second light-absorbing layer 272 is collected from all directions (in other words, from all sides) in the pyroelectric capacitor 230. In this case, the pyroelectric capacitor 230 is disposed below the middle of the roughly square-shaped thermal transfer member 260, as seen in plan view. Thus, the heat that is collected via the thermal transfer member 260 from all directions is transferred to the upper electrode (second electrode) 236 of the pyroelectric capacitor 230 through the shortest possible distance via the connecting portion CN. Thus, much of the heat is efficiently collected from a wide area, and the heat can be transferred to the upper electrode (second electrode) 236 of the pyroelectric capacitor 230 through the shortest possible distance while minimizing loss. Thus, the photodetection sensitivity of the thermal detector 200 can be additionally increased. In addition, the response rate of the thermal detector can be additionally improved.

In the present embodiment, heat is generated by the two light-absorbing films 270, 272, and absorption efficiency therefore increases. Heat can also be directly transferred to the heat-detecting element 230 via the first light-absorbing layer 270. The detection sensitivity of the thermal detector can thereby be enhanced relative to the infrared detection element described in Patent Citation 1 and the infrared solid-state image capture element described in Patent Citation 2. The heat-detecting element 230 is connected to the thermal transfer member 260 in the present embodiment. The response speed is therefore as high as in the infrared detection element described in Patent Citation 1. Since the thermal transfer member 260 is also directly connected to the heat-detecting element 230 in the present embodiment, a higher response speed is obtained than in the infrared solid-state image capture element described in Patent Citation 2.

Operation of Pyroelectric Infrared Detector

The thermal detector according to this embodiment presented in FIGS. 1A and 1B (thermal detector) operates in the manner described below.

Specifically, the light that is incident on the pyroelectric infrared detector 200, specifically, a portion of the incident light (e.g., infrared light) that is incident on a region of the support member (membrane) 215 as seen in plan view, is absorbed first by the second light-absorbing layer 272, and the rest of the light reaches the thermal transfer member 260 without being absorbed. The thermal transfer member 260 is transmissive with respect to light in the wavelength range to which the pyroelectric infrared detector 200 has detection sensitivity, and, for example, is semi-transmissive with respect to infrared light. At the thermal transfer member 260, a portion of the arriving light, for example, is reflected, and the rest of the light passes through the thermal transfer member 260. A portion of the light passed through the thermal transfer member 260 is absorbed at the first light-absorbing layer 270 and the rest of the light reaches the surface of the light-reflecting layer 235 formed on the support member (membrane) 215, and the surface of the support member (membrane) 215 and the pyroelectric capacitor 230 that is the heat-detecting element.

A large portion (e.g., most) of the light incident on the light-reflecting layer 235 is reflected by the surface thereof and is absorbed by at least one of the first light-absorbing layer 270 and the second light-absorbing layer 272, and heat is thereby generated in the first light-absorbing layer 270 or the second light-absorbing layer 272. In other words, the presence of the light-reflecting layer 235 reduces the transmission and downward escape of the incident light through the support member (membrane) 215, and as a result, more of the incident light can be converted to heat, and the light can be effectively utilized.

The light reflected by the surface of the support member (membrane) 215 is also absorbed by at least one of the first light-absorbing layer 270 and the second light-absorbing layer 272, and heat is thereby generated in the first light-absorbing layer or the second light-absorbing layer. For example, in a case in which the first light-absorbing layer 270 is constituted by an $SiO_2$ layer (refractive index 1.45) and the support member (membrane) 215 is constituted by an SiN layer (refractive index 2.0), because the refractive index (i.e., the refractive index of the support member 215) of the film constituting the support member (membrane) 215 is greater than the refractive index of the first light-absorbing layer 270, almost all of the light that reaches the support member (membrane) 215 is reflected by the surface of the support member (membrane) 215.

It is also effective to provide a titanium (Ti) film, for example, or other metal film as a constituent element of the support member (membrane) 215 (preferably provided on the surface where light is reflected), thereby increasing the light reflectance at the surface of the support member (membrane) 215 (i.e., the surface to which the light-reflecting layer 235 is not provided). The light reflected by the surface of the support member (membrane) 215 is absorbed by the first light-absorbing layer 270 or the second light-absorbing layer 272.

Incident light generates heat in the first light-absorbing layer 270 and second light-absorbing layer 272, and the generated heat is transferred to the pyroelectric capacitor 230 as the heat-detecting element in the manner described below, for example, in a case in which the incident light behaves as described above.

Specifically, a portion of the light that is incident on the thermal detector 200 is first absorbed by the second light-absorbing layer 272, and heat is generated in the second light-absorbing layer 272. The light reflected by the thermal transfer member 260 is absorbed by the second light-absorbing layer 272, and heat is thereby generated in the second light-absorbing layer 272.

A portion of the light passed (transmitted) through the thermal transfer member 260 is absorbed by the first light-absorbing layer 270 to generate heat. The rest of the light reaches the pyroelectric capacitor 230 as the thermal detection element, the surface of the light-reflecting layer 235, and the surface of the support member (membrane) 215.

As described above, since the light-reflecting layer 235 is constituted by a material (e.g., a metal material) having high optical reflectance, a large portion (e.g., most) of the light that is incident on the surface of the light-reflecting layer is reflected, and the reflected light is absorbed by the first light-absorbing layer 270 or the second light-absorbing layer 272. The incident light can thereby be utilized without loss and converted to heat.

Since the light-reflecting layer 235 is formed apart from the pyroelectric capacitor 230 which is the heat-detecting element, the heat in the pyroelectric capacitor 230 does not escape via the light-reflecting layer 235. There is also no increase in parasitic capacitance of the pyroelectric capacitor 230.

The fact that a portion of the light that reaches the surface of the support member (membrane) 215 is also reflected and absorbed by the first light-absorbing layer 270 or second light-absorbing layer 272 also contributes to effective utilization of incident light.

The heat that has been generated by the second light-absorbing layer 272 is efficiently transferred to the pyroelectric capacitor 230 that is used as the heat-detecting element via the thermal transfer member 260, and the heat that has been generated by the first light-absorbing layer 270 is efficiently transferred to the pyroelectric capacitor 230, directly or via the thermal transfer member 260.

Specifically, the thermal collecting portion of the thermal transfer member 260 is formed so as to broadly cover the heat-detecting element 230, and thus most of the heat that is generated by the first light-absorbing layer 270 and the second light-absorbing layer 272 can be transferred efficiently to the heat-detecting element 230, regardless of the site at which it was generated. For example, even heat that has been generated at a location distant from the pyroelectric capacitor 230 can be efficiently transferred to the heat-detecting element 230 via the thermal transfer member 260 having high thermal conductivity.

In addition, because the thermal collecting portion FL of the thermal transfer member 260 and the pyroelectric capacitor 230 are connected by the connecting portion CN of the thermal transfer member 260, the heat that is transmitted via the thermal collecting portion FL of the thermal transfer member 260 can be directly transmitted to the pyroelectric capacitor 230 via the connecting portion CN. Moreover, because the pyroelectric capacitor 230 that is used as the heat-detecting element is positioned under (directly under) the thermal transfer member 260 (provided in positions that are superimposed as seen in plan view), it is possible, for example, to connect the pyroelectric capacitor 230 and the middle part of the thermal transfer member 260 via the shortest possible distance, as seen in plan view. Thus, the loss occurring with heat transfer can be decreased, and an increase in footprint can be minimized.

In this manner, in accordance with the thermal detector described in FIGS. 1A and 1B (in this case a pyroelectric-type infrared detector), the heat that has been generated over a large region in two (a plurality of) light-absorbing layers 270, 272 can be efficiently transferred to the pyroelectric capacitor 230 which is used as the heat-detecting element. Thus, the light detection sensitivity of small-size thermal detectors (pyroelectric-type infrared photodetectors) can be greatly increased. Moreover, the time required for light transfer is decreased, and so the response rate of the thermal detector (pyroelectric-type infrared photodetector) can be increased.

In addition, with the thermal detector (pyroelectric-type infrared photodetector) described in FIGS. 1A and 1B, the first light-absorbing layer 270 and the second light-absorbing layer 272 are formed surrounding the pyroelectric capacitor 230 used as the heat-detecting element as seen in plan view on the support member 215 (or the mounting part 210 thereof). As a result, the heat that is generated over a large region of the first light-absorbing layer 270 and the second light-absorbing layer 272 is extremely efficiently transferred to the pyroelectric capacitor 230 used as the heat-detecting element, either directly or indirectly via the thermal transfer member 260. Thus, the light detection sensitivity of the thermal detector (pyroelectric-type infrared photodetector) can be additionally increased, and the response rate of the thermal detector (pyroelectric-type infrared photodetector) can be additionally increased.

As described above, with the thermal detector (pyroelectric infrared detector) described in FIGS. 1A and 1B, a first optical resonator for a first wavelength $\lambda 1$ is configured between the upper surface of the second light-absorbing layer 272 and the surface of the light-reflecting layer 235 formed on the support member 215, and a second optical resonator for a second wavelength $\lambda 2$ that is different form the first wavelength $\lambda 1$ is configured between the lower surface of the second light-absorbing layer 272 and the upper surface of the second light-absorbing layer 272. Specifically, by adjusting the film thickness of the first light-absorbing layer 270 and the second light-absorbing layer 272, two optical resonators can be configured that have different resonance wavelengths.

As described above, the light reflected by the surface of the light-reflecting layer 235 is absorbed by at least one of the first light-absorbing layer 270 and the second light-absorbing layer 272, and the effective absorption in the respective light-absorbing layers can be increased by configuring a first optical resonator.

The first optical resonator can be, for example, a so-called $\lambda/4$ optical resonator. Specifically, taking the first wavelength as $\lambda 1$, the film thicknesses of the first light-absorbing layer 270 and the second light-absorbing layer 272 are adjusted so that the distance H1 (total film thickness H1 of the first light-absorbing layer 270 and the second light-absorbing layer 272 when the film thickness of the light-reflecting layer can be ignored) between the surface of the light-reflecting layer 235 and the upper surface of the second light-absorbing layer 272 satisfies the relationship: $n \cdot (\lambda 1/4)$ (where n is an integer equal to or greater than 1). As a result, incident light of wavelength $\lambda 1$ and light of wavelength $\lambda 1$ that is reflected by the surface of the light-reflecting layer 235 cancel each other out due to mutual interference, and the effective absorption of the first light-absorbing layer 270 and the second light-absorbing layer 272 is increased.

Since the light-reflecting layer 235 is constituted by a material having high light reflectance, a large portion of the light that is incident on the light-reflecting layer 235 can be reflected upward. Resonance of light thereby readily occurs.

Since interference with incident light also occurs for the light reflected by the surface of the support member (membrane) 215, resonance readily occurs in the first optical resonator.

Moreover, as described above, the light that has been reflected at the thermal transfer member 260 is absorbed at the second light-absorbing layer 272, but by constituting the second optical resonator, effective absorption in the second light-absorbing layer 272 can be increased, in this case. A so-called λ/4 optical resonator, for example, may be used as the second optical resonator.

Specifically, taking the second wavelength as λ2, the second optical resonator can be constituted by setting the distance between the bottom surface of the second light-absorbing layer 272 and the top surface of the second light-absorbing layer 272 (specifically, the film thickness of the second light-absorbing layer) to n·(λ2/4). As a result, incident light of wavelength λ2 and light of wavelength λ2 that has been reflected at the bottom surface of the second light-absorbing layer (interface between the first light-absorbing layer 270 and the second light-absorbing layer 272) cancel each other out due to mutual interference, thereby increasing the effective absorption at the second light-absorbing layer 272.

Moreover, by having a configuration involving two optical resonators, the wavelength bandwidth of light that can be detected by the thermal detector can be increased as a result of peaks synthesis because a resonance peak is produced at the two different wavelengths. In other words, the wavelength bandwidth (wavelength range) that can be detected by the thermal detector can be increased.

Preferred Example of Thermal Transfer Member

A preferred example of the thermal transfer member (thermal transfer layer) is described below. As described above, with the thermal detector 200 of this embodiment, a structure is used in which the heat thermal collecting portion FL in the thermal transfer member 260 is sandwiched by the first light-absorbing layer 270 and the second light-absorbing layer 272. Thus, in addition, the thermal collecting portion FL of the thermal transfer member 260 can collect even heat that has been generated at positions that are far from the pyroelectric capacitor 230 that is used as the heat-detecting element. As a result, it is preferable for the thermal collecting portion to have a large surface area as seen in plan view. Given this situation, it is preferable for the thermal transfer member 260 to be constituted by a material that is transmissive to light and allows light of at least some of the wavelengths that are in the desired wavelength range to pass, so that light that is incident from above the thermal detector 200 is absorbed by both the first light-absorbing layer 270 and the second light-absorbing layer 272.

Specifically, the thermal transfer member 260 is preferably constituted by a material that has thermal conductivity and light transmissivity and has favorable thermal transfer properties. The thermal transfer member 260, can be constituted, for example, by aluminum nitride (AlN) or aluminum oxide ($AlO_x$). The aluminum oxide is also referred to as alumina, and $Al_2O_3$ may also be used, for example.

Figure 2A:
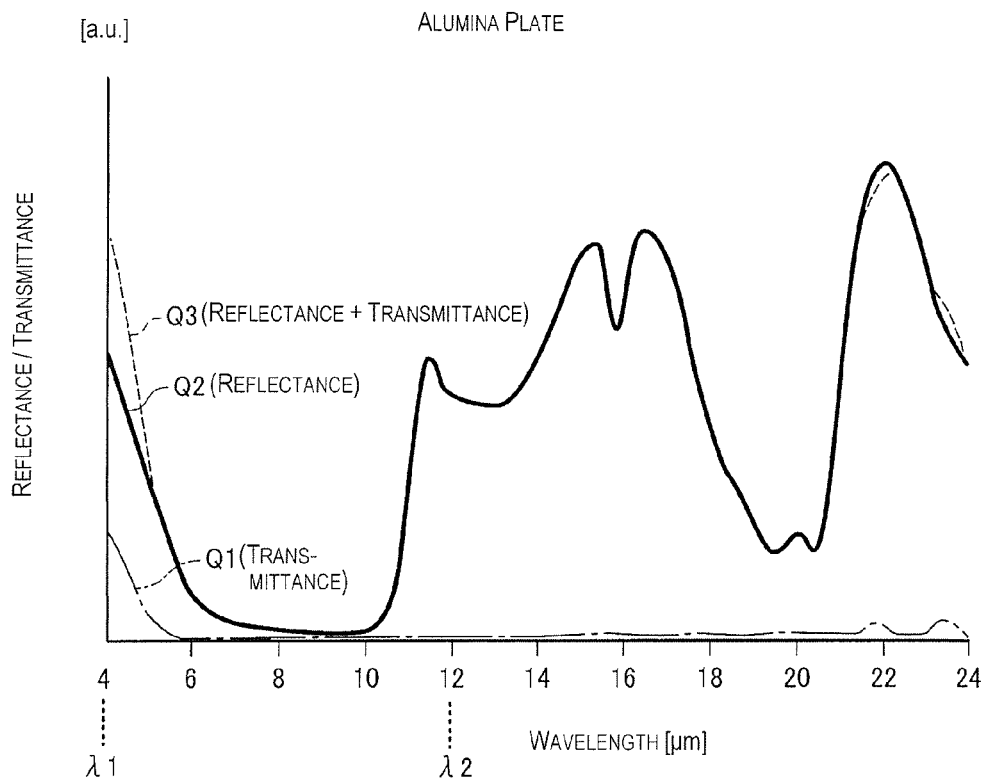
FIG. 2A is a diagram showing an example of the spectral characteristics (light-reflecting characteristics and light-transmission characteristics) of an alumina plate in the far-infrared wavelength range.
Figure 2B:
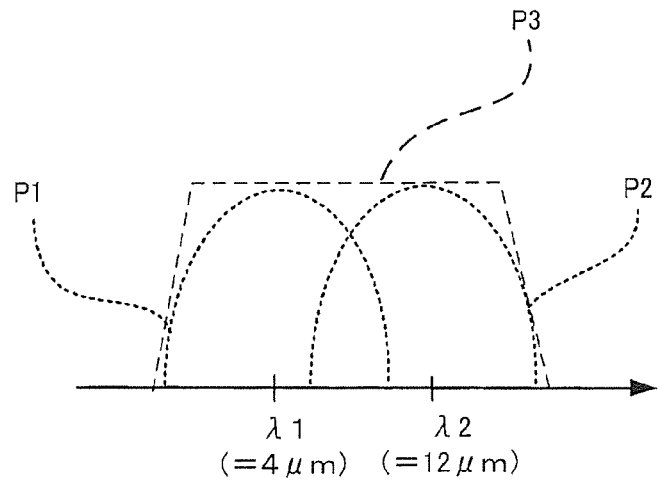
FIG. 2B is a diagram showing an example of the detection sensitivity of the thermal detector having a double optical resonator configuration.

FIG. 2A is a diagram that show an example of the spectral characteristics (light reflection characteristics and light transmission characteristics) of the alumina plate in the far-infrared light wavelength range and FIG. 2B is a diagram that shows an example of the detection sensitivity of the thermal detector when two optical resonators are configured.

Although the far-infrared light wavelength range is not particularly strictly defined, the wavelength range of far-infrared light is generally about 4 μm to about 1000 μm. Infrared light is radiated by all bodies, and bodies having high temperatures radiate intense infrared light. The wavelength of peak radiation is inversely proportional to temperature, and the peak wavelength of infrared light radiated by a body at room temperature, 20° C., is about 10 μm.

FIG. 2A shows the reflectance and transmittance of an alumina plate in the wavelength range of 4 μm to 24 μm. The horizontal axis is wavelength (μm), and the vertical axis is relative intensity (arbitrary units: a.u.). In FIG. 2, the characteristic line Q1 indicating transmittance is represented as a dashed-dotted line, and the characteristic curve Q2 indicating reflectance is indicated as a solid line. Characteristic curve Q3 which shows the results of adding the reflectance and the transmittance is represented by a dotted line.

As shown in FIG. 2A, the reflectance varies widely in accordance with wavelength. On the other hand, the transmittance is nearly zero in the wavelength range of 6 μm and above.

Considering the transmittance and reflectance for light of wavelength 4 μm, the transmittance is 0.2 (in other words, 20%), and the reflectance is 0.5 (in other words, 50%). Considering the transmittance and reflectance for light of wavelength 12 μm, the transmittance is nearly 0 (0%), and the reflectance is about 0.43 (43%).

Considering these spectral characteristics, the first wavelength λ1 described above can be set to 4 μm, and the second wavelength λ2 can be set to 12 μm. In this case, if the film thickness of the first light-absorbing layer 270 can be 3 μm, for example, then the film thickness of the second light-absorbing layer 272 can be 1 μm, for example.

When alumina having the spectral characteristics shown in FIG. 2A is used as the material for the thermal transfer member 260, about 50% of the light having wavelengths of the first wavelength λ1 (=4 μm) contained in the incident light is reflected by the thermal transfer member 260 that is formed from alumina, and about 20% of light having a wavelength of the first wavelength λ1 (=4 μm) contained in the incident light passes through the thermal transfer member 260.

The light of wavelength λ1 that has passed through the thermal transfer member 260 reaches the support member (membrane) 215 and is reflected at the surface thereof, then moves upwards towards the second light-absorbing layer 272, where some of this light is reflected at the top surface of the second light-absorbing layer 272 (interface between the atmosphere and the second light-absorbing layer 272) and is directed downwards again. In this manner, resonance can arise at wavelength λ1 in the first optical resonator.

In addition, about 43% of the light of wavelength λ2 (=12 μm) contained in the incident light is reflected by the thermal transfer member 260 (almost no transmitted light), and the reflected light moves upwards through the second light-absorbing layer 272. Some of this light is reflected at the top surface of the second light-absorbing layer 272 (interface between the atmosphere and the second light-absorbing layer 272), and is again directed downwards. In this manner, resonance can be made to arise at wavelength λ2 in the second optical resonator.

As a result of the generation of optical resonance as described above, the effective light absorption in the first light-absorbing layer 270 and the second light-absorbing layer 272 can be increased.

As shown in FIG. 2B, the wavelength range in which the thermal detector has detection sensitivity can be increased. FIG. 2B is a diagram showing an example of the detection sensitivity of a thermal detector for a case in which two optical resonators are constituted. In the example shown in FIG. 2B, the resonance peak P1 produced by the first optical resonator appears at wavelength λ1 (e.g., λ1=4 μm), and the resonance peak P2 produced by the second optical resonator appears at wavelength λ2 (e.g., λ2=12 μm). By synthesizing these peak characteristics, the detection sensitivity P3 of the thermal detector 200 is widened. In other words, a thermal detector 200 is realized that has detection sensitivity over a broad range of wavelengths. Similar effects can be obtained when aluminum nitride (AlN) is used as the material for the thermal transfer member 260.

In this manner, in accordance with the thermal detector of this embodiment, the heat that is generated at locations distant from the heat-detecting element can be efficiently and rapidly collected in the pyroelectric capacitor 230 that is used as the heat-detecting element through the thermal collecting portion FL of the thermal transfer member (thermal transfer layer) 260. In addition, by utilizing interference between light wavelengths (optical resonance), it is possible to increase the effective absorption of light at the first light-absorbing layer 270 and the second light-absorbing layer 272. It is also possible to widen the wavelength range in which the thermal detector has detection sensitivity.

Thermal Detector Manufacturing Method

The thermal detector manufacturing method is described below with reference to FIGS. 3 to 5. First, FIGS. 3A to 3E will be discussed. FIGS. 3A to 3E are diagrams that show the steps of the thermal detector manufacturing method up until formation of the first light-absorbing layer.

In the step shown in FIG. 3A, a silicon substrate (which may have elements such as transistors) is prepared, and a structure 100 including an insulating layer (e.g., a multilayer wiring structure) is formed on the silicon substrate 10. An etching stopper film 130a is then formed on the structure 100 including the insulating layer, and a sacrificial layer (e.g., an SiO₂ layer) 101 is then formed.

In the step of FIG. 3B, an etching stopper film 130b is formed on the sacrificial layer 101. Next, a thick film that will serve as the support member (membrane) 215 (e.g., a thick film composed of a three-layer laminated film) is formed.

In the step shown in FIG. 3C, the lower electrode (first electrode) 234, the pyroelectric material layer (PZT layer) 232, and the upper electrode (second electrode) 236 are layered on the support member (membrane) 215, and the pyroelectric capacitor 230 is formed as the heat-detecting element. The light-reflecting layer 235 is also formed apart from the pyroelectric capacitor 230 in at least a portion (preferably the peripheral region) of the peripheral region of the pyroelectric capacitor 230. The light-reflecting layer 235 is formed apart from the pyroelectric capacitor 230, which is the heat-detecting element, in at least a portion of the peripheral region of the heat-detecting element on the support member 215.

For example, the light-reflecting layer 235 may be constituted by the same material (e.g., a three-layer structure of iridium (Ir), iridium oxide (IrOx), and platinum (Pt)) as the lower electrode (first electrode) 234, which is a constituent element of the pyroelectric capacitor 230. In this case, the lower electrode (first electrode) 234 and the light-reflecting layer 235 can be formed simultaneously by forming the same material primarily composed of a metal on the mounting part 210 of the support member 215 and patterning the material.

In the step of FIG. 3C, a lower electrode (first electrode) 234, a pyroelectric material layer (PZT layer) 232, and an upper electrode (second electrode) 236 are layered on the support member (membrane) 215 to form the pyroelectric capacitor 230 that is used as the heat-detecting element. The method for forming the pyroelectric capacitor 230, for example, can be an atomic layer CVD method. Next, the insulating layer 250 is formed so that it covers the pyroelectric capacitor 230. The insulating layer 250 can be formed, for example, by a CVD method. Next, the insulating layer 250 is patterned.

In the step of FIG. 3D, the first contact hole 252 is formed in the insulating layer 250 that covers the pyroelectric capacitor 230, and a metal material layer is then deposited, whereupon the metal material layer is patterned in order to form the electrode (and wiring) 226 that connects with the upper electrode (second electrode) 236. In the step of FIG. 3D, wiring (not shown in) and an electrode that connects to the lower electrode (first electrode) are formed together.

In the step of FIG. 3E, the first light-absorbing layer (e.g., SiO₂ layer) 270 is formed by a CVD method. Next, this surface is planarized by, for example, chemical mechanical polishing (CMP).

Figure 4A:
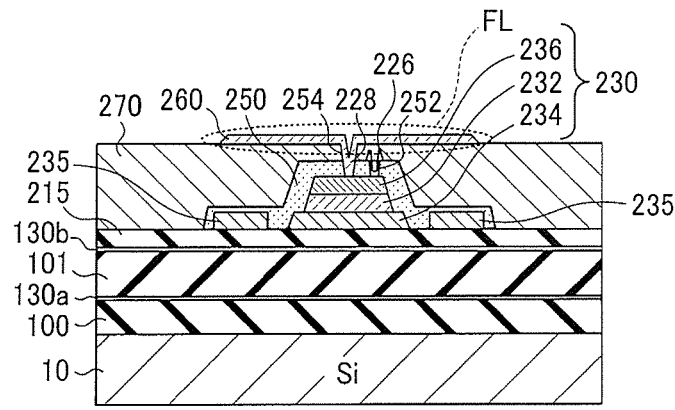
FIGS. 4A to 4C are diagrams showing the steps for patterning the first light-absorbing layer and the second light-absorbing layer in the thermal detector manufacturing method.
Figure 4B:
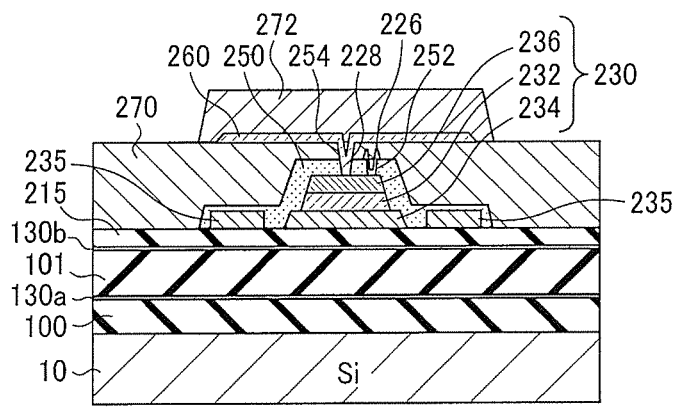
Figure 4C:
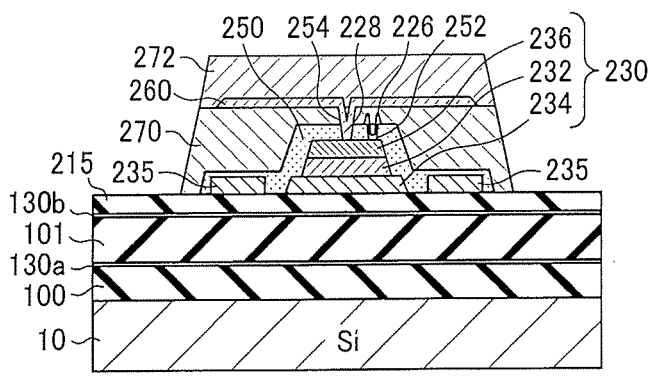

FIGS. 4A through 4C are views showing the primary steps previous to patterning the first light-absorbing layer and the second light-absorbing layer in the thermal detector manufacturing method. In the step shown in FIG. 4A, the second contact hole 254 is formed in the first light-absorbing layer 270. A material that has high thermal conductivity and is transmissive, such as aluminum oxide (alumina: AlO$_x$), aluminum nitride (AlN), or the like, is then deposited and patterned, whereby the thermal transfer member (thermal transfer layer) 260 is formed. The thermal transfer member 260 has the thermal collecting portion FN and the connecting portion CN. Alumina or another material is filled into the second contact hole 254. The portion 228 filled with the alumina or other material constitutes the connecting portion CN. The light-reflecting layer 235 and the thermal collecting portion FL of the thermal transfer member 260 are disposed parallel to each other.

In the step of FIG. 4B, a material layer that will form the second light-absorbing layer (e.g., SiO₂ layer) is deposited and patterned on the first light-absorbing layer 270. As a result, the second light-absorbing layer 272 is formed. In the step of FIG. 4C, the first light-absorbing layer 270 is patterned.

Figure 5A:
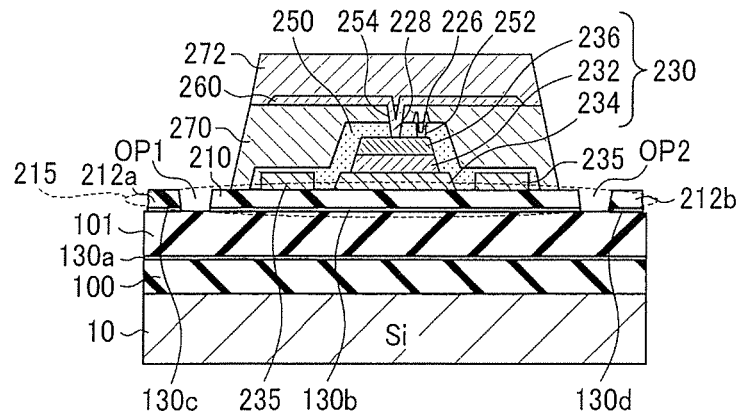
FIGS. 5A and 5B are diagrams showing the steps for completion of the thermal detector in the thermal detector manufacturing method.
Figure 5B:
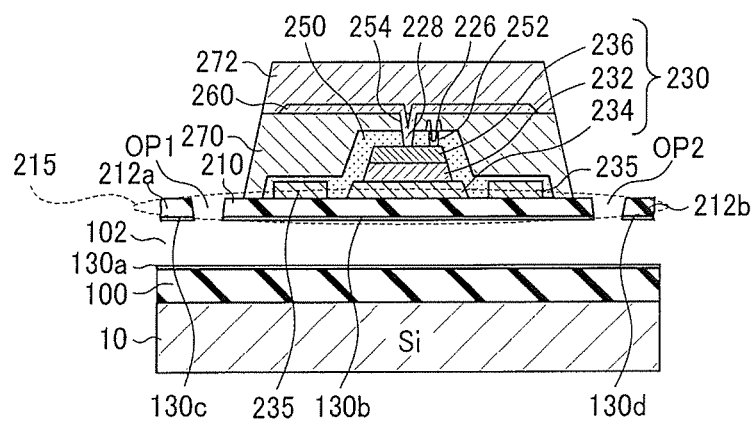

FIGS. 5A and 5B are diagrams that show the steps up to completion of the thermal detector in the thermal detector manufacturing method. In the step of FIG. 5A, the support member (membrane) 215 is patterned. As a result, the mounting part 210, the first arm part 212a, and the second arm part 212b are formed. In FIG. 5A, the reference symbol OP is used for the portions that are removed by patterning (openings).

In the step of FIG. 5B, the sacrificial layer 101 is selectively removed by, for example, wet etching. As a result, the cavity (thermal isolation cavity) 102 is formed. The mounting part 210 of the support member 215 is separated from the base part (substrate 10, structure 100 including insulating layer, and etching stopper film 130a) by the cavity 102. Consequently, release of heat through the support member 215 is inhibited. The thermal detector is completed in this manner.

Embodiment 2

Figure 6:
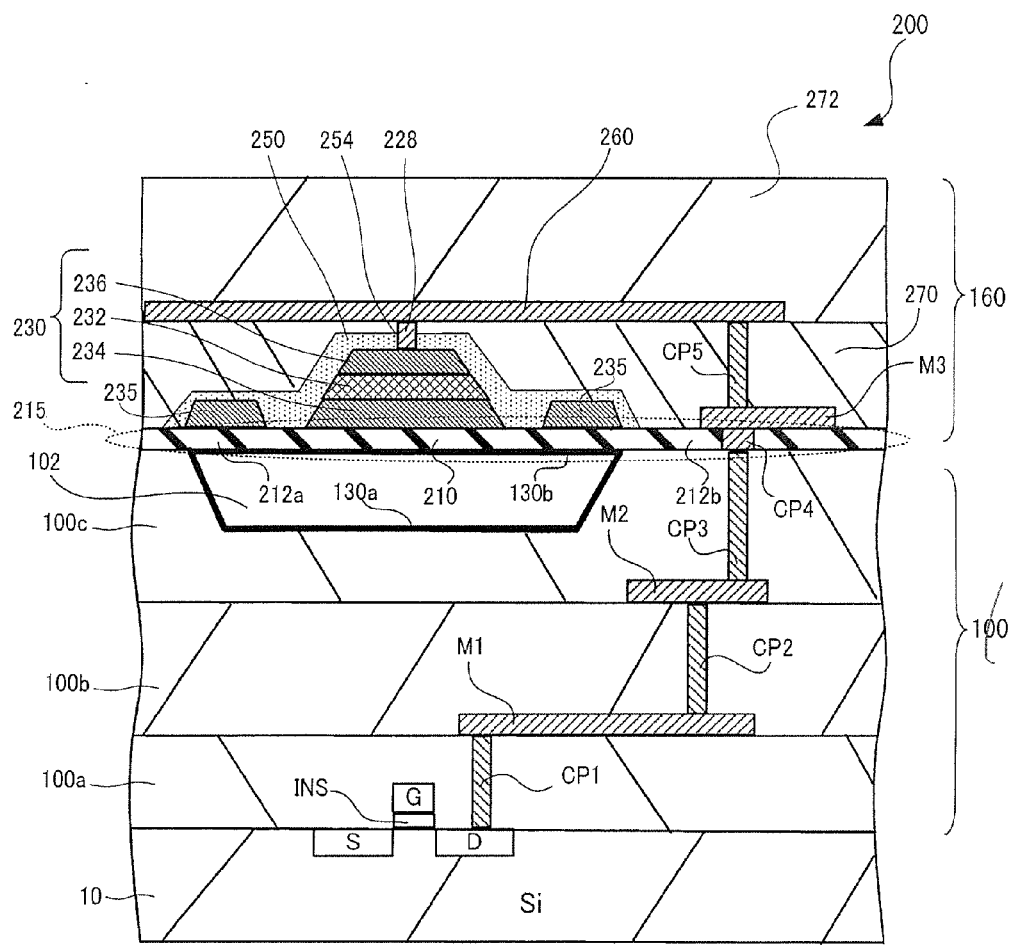
FIG. 6 is a diagram showing another example of the thermal detector.

Referring now to FIG. 6, a thermal detector in accordance Embodiment 2 will now be explained. In view of the similarity between the first and second embodiments, the parts of the second embodiment that are similar or identical to the parts of the first embodiment will be given the same reference numerals as the parts of the first embodiment. Moreover, the descriptions of the parts of the second embodiment that are identical to the parts of the first embodiment may be omitted for the sake of brevity.

FIG. 6 is a diagram showing another example of the thermal detector. With the thermal detector 200 shown in FIG. 6, the cavity 102 is formed for each individual heat-detecting element, and the support member (membrane) 215 is supported by the structure (part of the base part) that surrounds the cavity 102. In addition, a circuit constituent element (in this case, a MOS transistor) is formed in the region overlapping the heat-detecting element as seen in plan view. This MOS transistor is connected via multilayer wiring to the pyroelectric capacitor 230 that is used as the heat-detecting element. In the example of FIG. 6, the thermal transfer member 260 is utilized as wiring.

Specifically, a source layer (S) and a drain layer (D) are formed in the substrate (silicon substrate) 10. In addition, a gate insulating film INS and a gate electrode G (e.g., a polysilicon gate electrode) are formed on the substrate 10. As a result, a MOS transistor that serves as the circuit constituent element is formed.

The structure 100 including the insulating layer is formed on the substrate 10. The base (base) is constituted by the substrate 10 and the structure 100 including the insulating layer.

The structure 100 including the insulating layer is constituted by a multilayered structure, more specifically, a multilayer wiring structure. The multilayer wiring structure comprises a first insulating layer 100a, a second insulating layer 100b, a third insulating layer 100c, a first contact plug CP1, a first layer wiring M1, a second contact plug CP2, a second layer wiring M2, and a third contact plug CP3. Part of the third insulating layer 100c is selectively removed to form the cavity (thermal isolation cavity part) 102.

The pyroelectric capacitor 230 is formed as the heat-detecting element on the mounting part 210 of the support member (membrane) 215. In addition, the thermal transfer member 260 is formed between the first light-absorbing layer 270 and the second light-absorbing layer 272.

The element structure 160 is constituted by the support member (membrane) 215, the pyroelectric capacitor 230, the first light-absorbing layer 270, the second light-absorbing layer 272, the thermal transfer member 260, a fourth contact plug CP4, a third layer wiring M3, and a fifth contact plug CP5. As described above, the thermal transfer member 260 also functions as part of the wiring that connects the pyroelectric capacitor 230 that is used as the heat-detecting element to the other elements (in this case, a CMOS transistor that is formed on the substrate 10).

Specifically, as described above, the thermal transfer member 260 can be constituted by a metal compound such as AlN or $AlO_x$, but because materials having metals as primary components also have favorable electrical conductivity, the thermal transfer member 260 can also be utilized as wiring (or part of the wiring) that connects the heat-detecting element to other elements. By using the thermal transfer member 260 as wiring, it is not necessary to provide separate wiring, and the production steps can be simplified.

Thermal Detection Device

Figure 7:
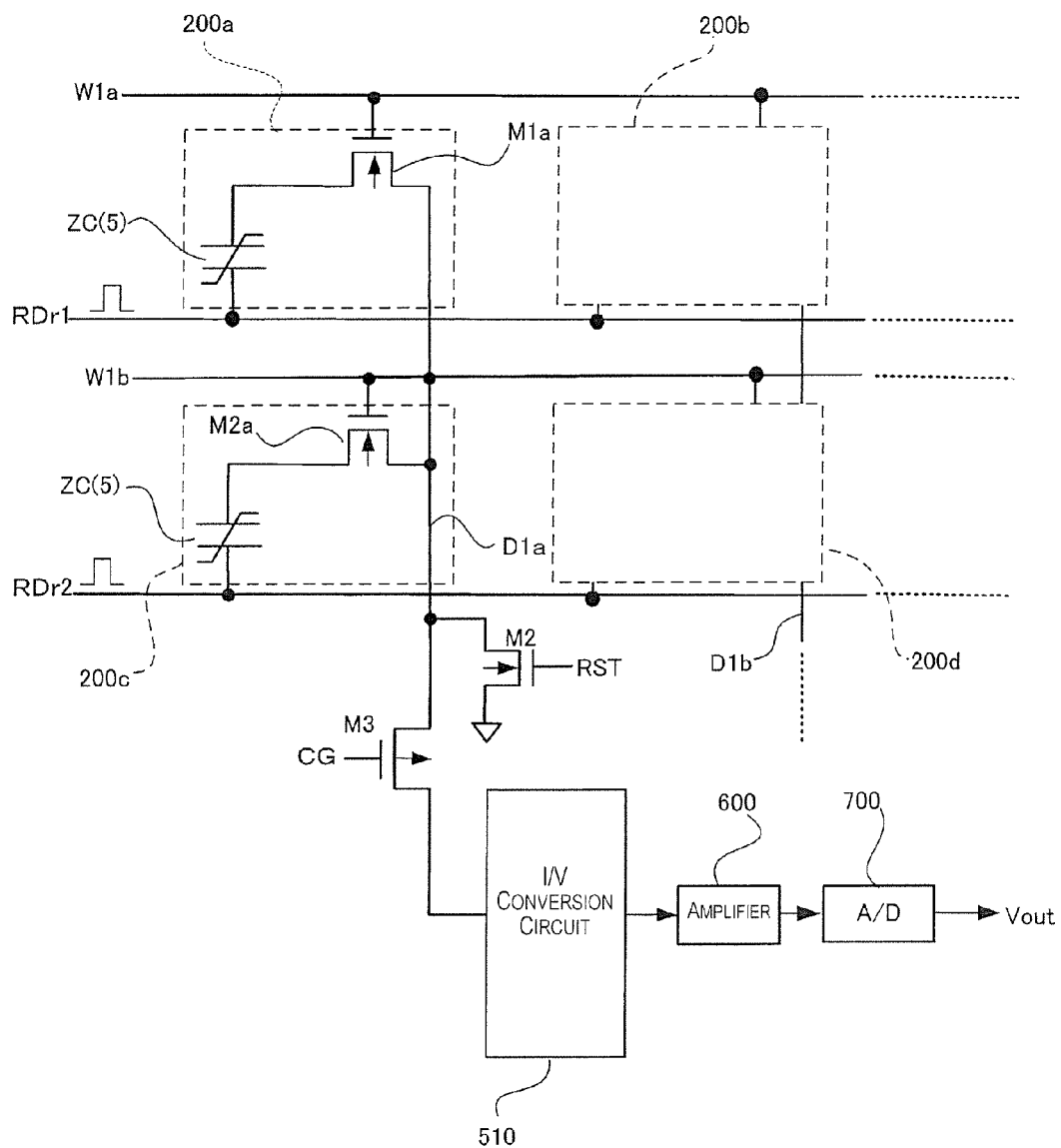
FIG. 7 is a circuit diagram showing an example of the circuit configuration of a thermal detection device (thermal detector array).

FIG. 7 is a circuit diagram that shows an example of a circuit configuration for the thermal detector (thermo-optical detecting array) including the thermal detector according to any of the illustrated embodiments. In the example of FIG. 7, a plurality of photodetecting cells (specifically, thermal detectors 200a to 200d) are disposed two-dimensionally. In order to select single photodetecting cells from among the plurality of photodetecting cells (thermal detectors 200a to 200d), scan lines (W1a, W1b, etc.) and data lines (D1a, D1b, etc.) are provided.

The thermal detector 200a that serve as a single photodetecting cell has an element-selection transistor M1a and a piezoelectric capacitor ZC that serves as the thermo-optical detecting element 5. The potential relationship of the two poles of the piezoelectric capacitor ZC can be inverted by switching the potential that is applied to PDr1 (by inverting this potential, it is not necessary to provide a mechanical chopper). Other photodetecting cells are similarly configured.

The potential of the data line D1a can be initialized by turning on a reset transistor M2. When reading a detection signal, the read transistor M3 is ON. The current that is generated as a result of the pyroelectric effect is converted to voltage by an IN conversion circuit 510, amplified by an amplifier 600, and converted to digital data by an A/D converter 700.

In this embodiment, a plurality of thermal detectors is disposed two-dimensionally (for example, disposed in the form of an array along two respective perpendicular axes (X-axis and Y-axis)), thereby realizing a thermal detection device (thermal-type optical array sensor).

Electronic Instrument

Figure 8:
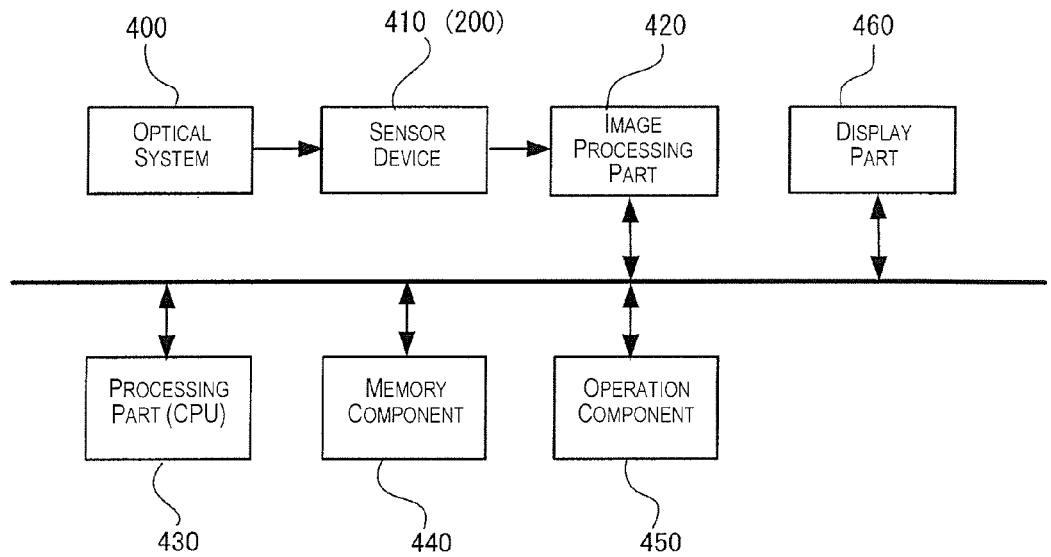
FIG. 8 is a diagram showing an example of the configuration of an electronic instrument.

FIG. 8 is a diagram showing an example of the configuration of an electronic instrument. Examples of the electronic instrument include an infrared sensor device, a thermographic device, and an on-board automotive night-vision camera or surveillance camera.

As shown in FIG. 8, the electronic instrument comprises an optical system 400, a sensor device 410 (corresponding to the thermal detector 200 in the previous embodiment), an image processing part 420, a processing part 430, a memory component 440, an operation component 450, and a display part 460. The electronic instrument of this embodiment is not restricted to the configuration of FIG. 8, and various modified embodiment are possible in which some of the constituent elements (e.g., the optical system, operational, part, or display part) are omitted and other constituent elements are added.

The optical system 400 includes one or a plurality of lenses and driving parts for driving these lenses. Imaging and the like of the subject is carried out on the sensor device 410. In addition, focus adjustment may be carried out as necessary.

The sensor device 410 has a configuration in which the photodetectors of the embodiments described above are laid out two-dimensionally, and a plurality of lines (scan lines (or word lines)) and a plurality of columns (data lines) are provided. The sensor device 410 can also comprise line selection circuits (line drivers), a read circuit for reading data from the photodetectors via the columns, an A/D converter, and the like, in addition to the photodetectors that are laid out two-dimensionally. Because data is sequentially read from photodetectors that are laid out two-dimensionally, a captured image of the subject can be processed.

Based on the digital image data (pixel data) from the sensor device 410, the image processing part 420 carries out various image processing operations such as image correction processing. The image processing part 420 corresponds to the control part that processes the output of the sensor device 410 (thermal detector 200). The processing part 430 carries out control of the respective elements of the electronic instrument and overall control of the electronic instrument. This processing part 430 is realized, for example, in a CPU or the like. The memory component 440 stores various types of information, and, for example, functions as a work space for the processing part 430 or the image processing part 420. The operation component 450 is used as an interface for a user to operate the electronic instrument and can be worked, for example, in the form of various buttons, a GUI (graphical user interface) screen, or the like.

The display part 460 displays the GUI screen, images that have been captured by the sensor device 410, and the like, and is worked in the form of various types of displays, such as a liquid crystal display or organic EL display.

By using the thermal detector of a single cell as a sensor such as an infrared light sensor in this manner and by disposing the thermal detector of each cell along two perpendicular axes, a sensor device (thermo-optical detecting device) 410 can be configured. When this is done, a thermal (light) distribution image can be captured. By using this sensor device 410, it is possible to configure an electronic instrument such as a thermographic device, or an on-board automotive night-vision camera or surveillance camera.

As described previously, the thermal detector according to the present invention has high light detection sensitivity. Thus, the performance of the electronic instrument in which the thermal detector is mounted is increased.

Figure 9:
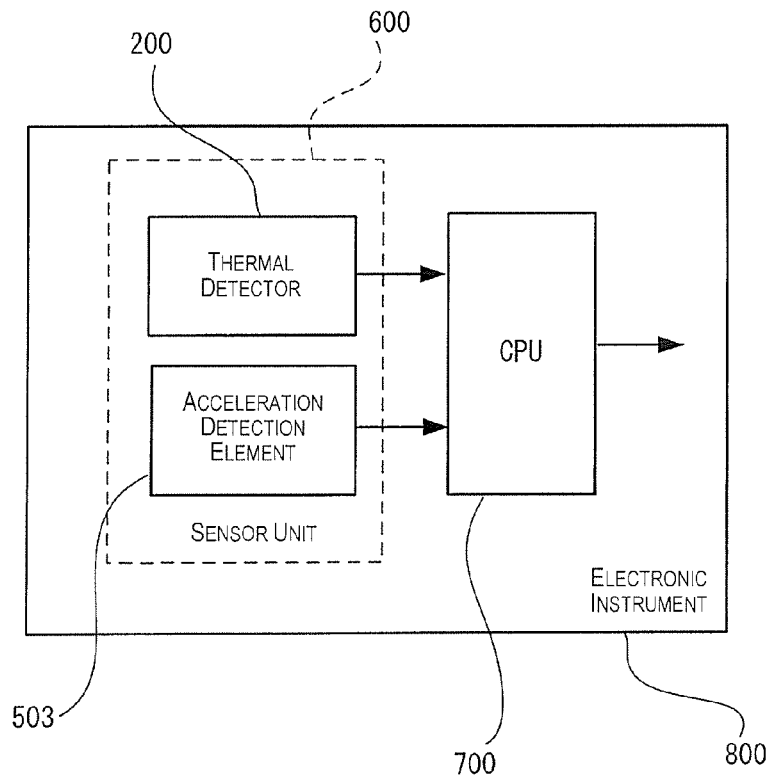
FIG. 9 is a diagram showing another example of the configuration of an electronic instrument.

FIG. 9 is a diagram showing another example of the configuration of the electronic instrument. The electronic instrument 800 of FIG. 9 comprises a thermal detector 200 and an acceleration detection element 503 which are mounted in a sensor unit 600. The sensor unit 600 also can carry a gyro sensor or the like. Various types of physical quantities can be measured by the sensor unit 600. The various detection signals that are output from the sensor unit 600 are processed by a CPU 700. The CPU 700 corresponds to the control part for processing the output of the thermal detector 200.

As described above, in accordance with at least one embodiment of the present invention, for example, the detection sensitivity of a thermal detector can be dramatically improved.

In addition, in the embodiments described above, although a pyroelectric capacitor is used as the heat-detecting element, a thermopile element or bolometer element may be used instead.

In addition, in the embodiments described above, an infrared detector that detects infrared light is used as an example of a thermal detector. However, it will be apparent from this disclosure that the thermal detector according to the present invention may be configured and arranged to detect other type of light such as terahertz light, for example.

General Interpretation of Terms

In understanding the scope of the present invention, the term "comprising" and its derivatives, as used herein, are intended to be open ended terms that specify the presence of the stated features, elements, components, groups, integers, and/or steps, but do not exclude the presence of other unstated features, elements, components, groups, integers and/or steps. The foregoing also applies to words having similar meanings such as the terms, "including", "having" and their derivatives. Also, the terms "part," "section," "portion," "member" or "element" when used in the singular can have the dual meaning of a single part or a plurality of parts. Also as used herein to describe the above embodiments, the following directional terms "top", "bottom", "upper", "lower", "forward", "rearward", "above", "downward", "vertical", "horizontal", "below" and "transverse" as well as any other similar directional terms refer to those directions of the thermal detector when the thermal detector is oriented as shown in FIG. 1B. Finally, terms of degree such as "substantially", "about" and "approximately" as used herein mean a reasonable amount of deviation of the modified term such that the end result is not significantly changed. For example, these terms can be construed as including a deviation of at least ±5% of the modified term if this deviation would not negate the meaning of the word it modifies.

While only selected embodiments have been chosen to illustrate the present invention, it will be apparent to those skilled in the art from this disclosure that various changes and modifications can be made herein without departing from the scope of the invention as defined in the appended claims. Furthermore, the foregoing descriptions of the embodiments according to the present invention are provided for illustration only, and not for the purpose of limiting the invention as defined by the appended claims and their equivalents. All modifications such as described above may be understood to fall within the scope of the invention. Terms disclosed together with different equivalent or broader terms in at least one instance in the specification or drawings, for example, may be replaced by these different terms at any place in the specification or drawings.

What is claimed is:

1. A thermal detector comprising:
   a substrate;
   a support member supported on the substrate so that a cavity is formed between the substrate and the support member;
   a heat-detecting element formed on the support member;
   a light-reflecting layer formed on the support member at a position spaced apart from the heat-detecting element in at least a portion of a peripheral region of the heat-detecting element;
   a light-absorbing layer formed on the heat-detecting element and the light-reflecting layer; and
   a thermal transfer member including a connecting portion connected to the heat-detecting element and a thermal collecting portion disposed inside the light-absorbing layer and having a surface area larger than a surface area of the connecting portion as seen in plan view, the thermal collecting portion being optically transmissive at least with respect to light of a prescribed wavelength.

2. The thermal detector according to claim 1, wherein the light-absorbing layer is disposed on the support member around the heat-detecting element.

3. The thermal detector according to claim 2, wherein the light-absorbing layer has
   a first light-absorbing layer contacting the thermal transfer member and disposed between the thermal transfer member and the light-reflecting layer, and
   a second light-absorbing layer contacting the thermal transfer member and disposed on the thermal transfer member.

4. The thermal detector according to claim 3, wherein
   a first optical resonator for a first wavelength is formed between a surface of the light-reflecting layer and an upper surface of the second light-absorbing layer, and
   a second optical resonator for a second wavelength that is different from the first wavelength is formed between a lower surface of the second light-absorbing layer and the upper surface of the second light-absorbing layer.

5. The thermal detector according to claim 1, wherein the thermal transfer member also serves as wiring that electrically connects the heat-detecting element to another element.

6. A thermal detection device comprising a plurality of the thermal detectors according to claim 1 arranged two-dimensionally.

7. A thermal detection device comprising a plurality of the thermal detectors according to claim 2 arranged two-dimensionally.

8. A thermal detection device comprising a plurality of the thermal detectors according to claim 3 arranged two-dimensionally.

9. A thermal detection device comprising a plurality of the thermal detectors according to claim 4 arranged two-dimensionally.

10. A thermal detection device comprising a plurality of the thermal detectors according to claim 5 arranged two-dimensionally.

11. An electronic instrument comprising:
the thermal detector according to claim 1; and
a control part configured to process an output of the thermal detector.

12. An electronic instrument comprising:
the thermal detector according to claim 2; and
a control part configured to process an output of the thermal detector.

13. An electronic instrument comprising:
the thermal detector according to claim 3; and
a control part configured to process an output of the thermal detector.

14. An electronic instrument comprising:
the thermal detector according to claim 4; and
a control part configured to process an output of the thermal detector.

15. An electronic instrument comprising:
the thermal detector according to claim 5; and
a control part configured to process an output of the thermal detector.

16. A thermal detector manufacturing method comprising:
forming a structure including an insulating layer on a surface of a substrate;
forming a sacrificial layer on the structure including the insulating layer;
forming a support member on the sacrificial layer;
forming a heat-detecting element on the support member;
forming a light-reflecting layer on the support member at a position spaced apart from the heat-detecting element in at least a portion of a peripheral region of the heat-detecting element;
forming a first light-absorbing layer so as to cover the heat-detecting element and the light-reflecting layer, and planarizing the first light-absorbing layer;
forming a contact hole in a portion of the first light-absorbing layer, subsequently forming a material layer which is thermally conductive and optically transmissive at least with respect to light of a prescribed wavelength, and patterning the material layer to form a thermal transfer member having a connecting portion that connects to the heat-detecting element and a thermal collecting portion having a surface area greater than that of the connecting portion as seen in plan view;
forming a second light-absorbing layer on the first light-absorbing layer;
patterning the first light-absorbing layer and the second light-absorbing layer;
patterning the support member; and
removing the sacrificial layer to form a cavity between the support member and the structure including the insulating layer formed on the surface of the substrate.

17. The thermal detector according to claim 1, wherein the thermal detector is configured and arranged to detect infrared light.

18. The thermal detector according to claim 1, wherein the thermal detector is configured and arranged to detect terahertz light.

19. The thermal detection device according to claim 6, wherein
the thermal detectors are configured and arranged to detect infrared light.

20. The thermal detection device according to claim 6, wherein
the thermal detectors are configured and arranged to detect terahertz light.

* * * * *